United States Patent [19]

Garcia

[11] 4,388,532
[45] Jun. 14, 1983

[54] SOLID STATE IMAGE SENSOR WITH IMAGE SENSING ELEMENTS HAVING CHARGE COUPLED PHOTOCAPACITORS AND A FLOATING GATE AMPLIFIER

[75] Inventor: Enrique Garcia, Sandy Hook, Conn.

[73] Assignee: Eastman Kodak Company, Rochester, N.Y.

[21] Appl. No.: 258,152

[22] Filed: Apr. 27, 1981

[51] Int. Cl.³ .................................... H04N 3/16
[52] U.S. Cl. .................................. 250/578; 357/24; 250/211 J
[58] Field of Search .................... 250/211 J, 578; 357/24 LR, 32, 31

[56] References Cited

U.S. PATENT DOCUMENTS

| | | | |
|---|---|---|---|
| 3,728,695 | 4/1973 | Frohman-Bentchkowsky | 340/173 R |
| 3,755,793 | 8/1973 | Ho et al. | 340/173 R |
| 3,858,232 | 12/1974 | Boyle et al. | 357/24 |
| 3,918,070 | 11/1975 | Shannon | 357/24 |
| 3,988,619 | 10/1976 | Malaviya et al. | 250/211 J |
| 3,999,082 | 12/1976 | Early | 307/221 D |
| 4,055,836 | 10/1977 | Weimer | 357/24 LR |
| 4,074,206 | 2/1978 | Horninger | 330/269 |
| 4,134,031 | 1/1979 | Weimer | 250/211 J |

OTHER PUBLICATIONS

Paper "Recent Development in CID Imaging" (1975) by G. J. Michon, H. K. Burke & D. M. Brown.

Primary Examiner—David C. Nelms
Assistant Examiner—J. Jon Brophy
Attorney, Agent, or Firm—Thomas H. Close

[57] ABSTRACT

A solid state image sensing array has a plurality of imaging sensing elements comprising first and second charge coupled MOS capacitors and a floating gate FET. The floating gate of the FET is disposed beneath the electrode of the second capacitor. In operation, a potential well is formed under the first capacitor. When the element is exposed to radiation, photochargers are accumulated in the potential well. To readout the photocharge, the charge is shifted under the second capacitor, thereby modulating the conductivity of the floating gate FET to provide signal sensing and amplification at the image sensing element. After readout, the photocharge can be purged from the sensing element by removing the potential from both capacitors, or if nondestructive readout is desired, the photocharge can be shifted back under the first capacitor.

6 Claims, 5 Drawing Figures

SOLID STATE IMAGE SENSOR WITH IMAGE SENSING ELEMENTS HAVING CHARGE COUPLED PHOTOCAPACITORS AND A FLOATING GATE AMPLIFIER

BACKGROUND OF THE INVENTION

1. Field of the Invention

This invention relates to X-Y addressable solid state image sensing arrays, and more particularly to novel image sensing elements in such arrays.

2. Description of the Problem

FIG. 1 shows a prior art image sensing array 10 of the type known as a charge injection device (CID). Depending upon the design, the device can be used to sense radiation in the visible or infrared portions of the spectrum. Briefly, CID 10 comprises an X-Y addressable array of pairs of adjacent MOS capacitors 11 and 12. The pairs of MOS capacitors comprise the image sensing elements of the array. The array is scanned in the X direction by a horizontal scan register 14; and in the Y direction by a vertical scan register 16. One pair of MOS capacitors is disposed at the junction of each horizontal and vertical scan line. One capacitor of each pair (e.g. capacitor 11) is connected to a horizontal scan line, and the other (e.g. capacitor 12) to a vertical scan line. As long as at least one of the MOS capacitors is biased "on" by one of the scan registers, a photogenerated minority charge can be stored beneath that capacitor. The photocharge can be shifted back and forth at will between the capacitors by always keeping at least one capacitor biased "on" and biasing the other capacitor "off." When both capacitors are biased "off," the photocharge is injected into the semiconductor substrate where it recombines to generate a readout current in the substrate. Early CID image sensors sensed this readout current as the packets of photocharge were injected one by one from the image sensing elements of the array into the substrate. Unfortunately, the recombination process is slow. Injected charges spread into neighboring sensing elements, and signals from consecutively readout elements are mixed together. To overcome these problems, special charge collectors were built into the CID image sensors to speed up the recombination process and to limit the lateral dispersion of the injected charges. Another problem faced with CID image sensors is the limitation on signal-to-noise ratio that arises due to the large capacitance of the input mode.

In a readout technique, called "parallel injection" the operation of sensing the image charge on one of the address lines and injecting the charge into the substrate are separated. The photocharge at each sensing site is detected during a line scan by transferring the charge from one capacitor to the other. Multiple readouts of the same charge pattern are possible with the technique, however, the load capacitance of the address line is still the limiting factor in signal-to-noise ratio achievable by the sensor. The inventor was faced with the problem of how to further increase the signal-to-noise ratio in a CID type image sensing device while maintaining the desirable features of X-Y addressability and nondestructive readout.

SOLUTION TO THE PROBLEM—SUMMARY OF THE INVENTION

The problems noted above are overcome according to the present invention by providing a solid-state image sensing array having a plurality of image sensing elements comprising first and second charge coupled MOS capacitors and a floating gate field effect transistor (FET). The floating gate of the FET is disposed under the electrode of the second capacitor. In operation a potential well is formed under the first capacitor, when the element is exposed to radiation, photocharges are accumulated in the potential well. To readout the photocharge, that charge is shifted under the second capacitor, thereby modulating the conductivity of the floating gate FET and providing signal amplification at each sensing element. According to the preferred embodiment of the invention, the elements are arranged in rows and columns. One of the MOS capacitors in each element of the elements in a row are connected in common to a vertical scan register. The other MOS capacitor in all of the elements of the array are connected in common to a bias potential. The drains of the FET's of the elements in each column are connected in common to a source of drain voltage through an FET switch. The FET switches for each column are driven by a horizontal scan register. The sources of the FET's in all the elements of the array are connected in common through a load to ground. The output signal from the array is available at a point in the common connection above the load.

BRIEF DESCRIPTION OF THE DRAWINGS

The invention will be described with reference to the accompanying drawings wherein.

DESCRIPTION OF THE PREFERRED EMBODIMENTS

Figure 1:
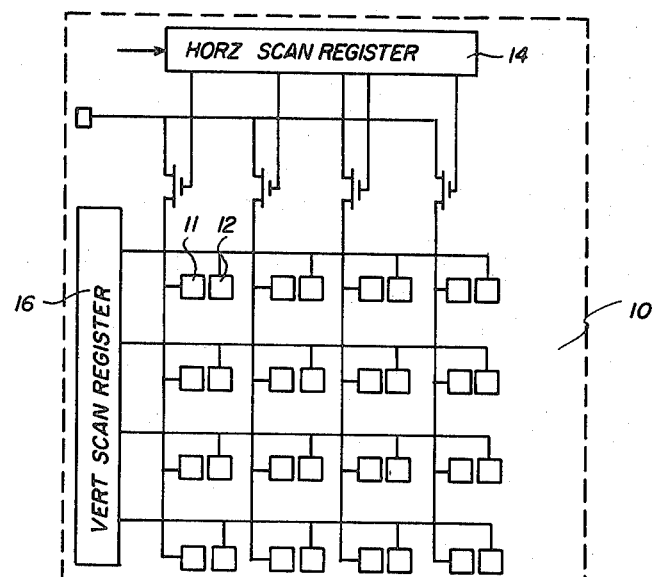
FIG. 1 is a schematic diagram showing a prior art two-dimensional X-Y addressable image sensor.
Figure 2:
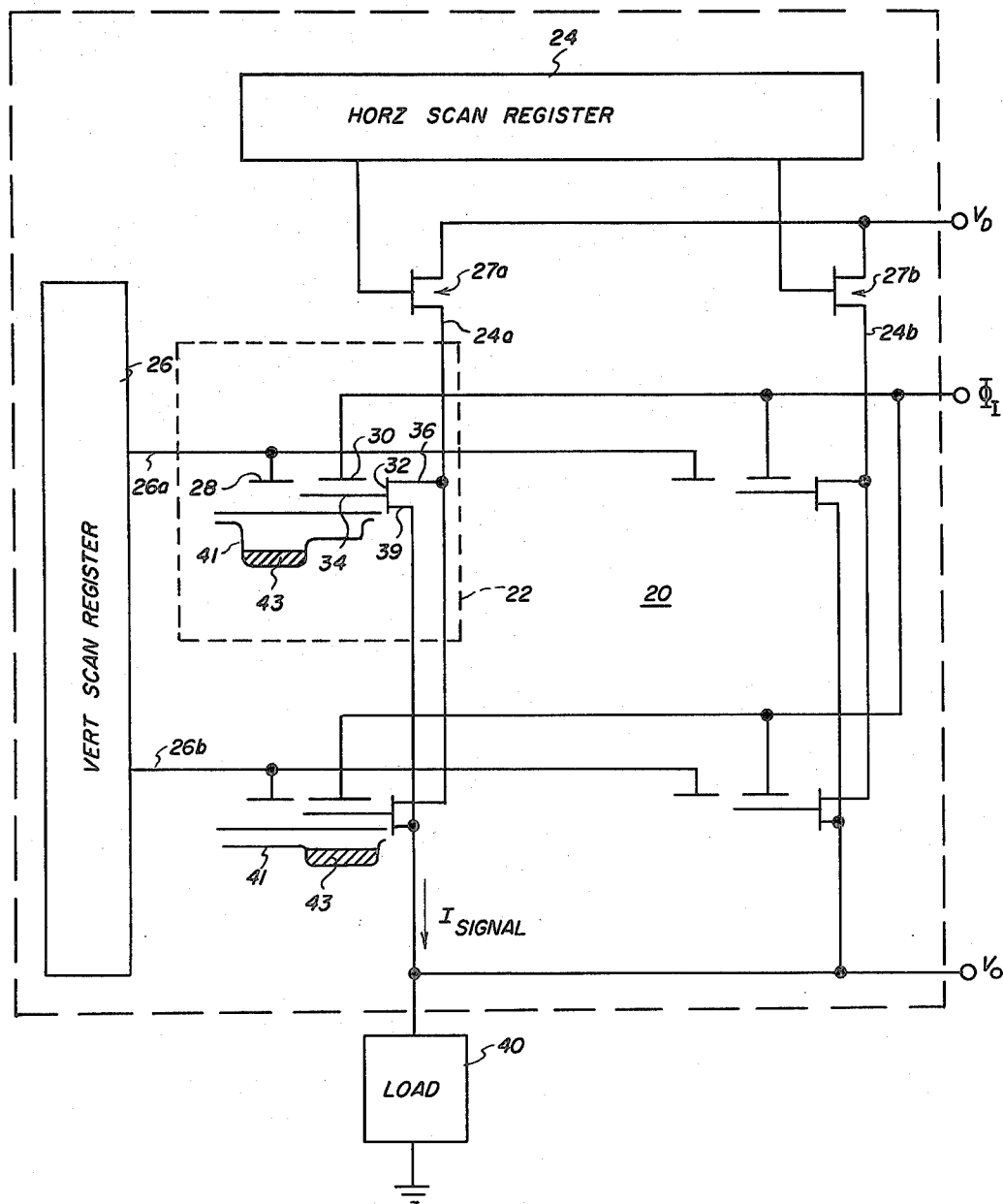
FIG. 2 is a schematic diagram showing a two-dimensional array (two rows by two columns) of image sensing sites according to the present invention.

Referring now to FIG. 2, an X-Y addressable array 20 of image sensing elements 22 according to the present invention is shown. The array is scanned as in the prior art by a horizontal scan register 24 and a vertical scan register 26, which drive a plurality of horizontal and vertical scan lines 24a, 24b . . . and 26a, 26b . . . respectively. Horizontal scan lines 24a, 24b . . . are connected to a voltage source $V_d$ through FET switches 27a, 27b . . . . The FET switches are driven by the horizontal shift register 24. An image sensing element 22 is disposed at the junction of each horizontal and vertical scan line. The image sensing element 22 comprises a first transparent electrode MOS capacitor 28 connected to a vertical scan line (e.g. line 26a); a second MOS capacitor 30 connected to a source of potential $\Phi_i$; and a floating gate FET 32 having a floating gate 34 disposed between the electrode of the second MOS capacitor 30 and the substrate. The drain 36 of FET 32 is connected to a horizontal scanning line (e.g. scanning line 24a), and the source 38 of FET 32 is connected through a load 40 (preferably located off-chip) to ground. An output signal $V_o$ is obtained from the line connecting the source to ground above load 40.

In operation, both $\Phi_i$ and the potentials supplied to the vertical scan lines 26a, 26b . . . are held high (e.g. 5 volts and 8 volts respectively) thereby forming a potential well 41 beneath MOS capacitors 28 and 30. Photocharge 43 is accumulated in the potential well beneath MOS capacitor 28 while the device is exposed to an imagewise pattern of radiation. This condition is shown schematically in FIG. 2 under the first image sensing element in the first column. After exposure for a predetermined time, the voltage is removed from one of the vertical scan lines (e.g. scan line 26b) thereby shifting all the photocharge to a position beneath the second MOS capacitor 30. This condition is shown schematically in FIG. 2 under the second image sensing element in the first column. The presence of the photocharge in the potential well beneath MOS capacitor 30 modulates the potential on the floating gate 34 of FET 32 and hence determines the conductivity through FET 32. The horizontal scan lines are connected, one at a time, to voltage source $V_d$ by horizontal shift register 24, thereby applying $V_d$ to the drains of the FET's. The amount of current conducted by the FET's is modulated by the photocharge in the wells underneath floating gates 34. Thus, with image sensing elements according to the present invention, the signal-to-noise ratio does not critically depend upon the output capacitance of the horizontal scan lines since the signal from each image sensing element receives preamplification, directly at the element location, by the floating gate FET. After the photocharges have been sensed, as described above, the image sensing elements may be reset by collapsing the potential wells beneath both capacitors 28 and 30, thereby injecting the photocharge into the substrate. Alternatively, the photocharge may be left in the image sensing element for multiple nondestructive readout.

Figure 3:
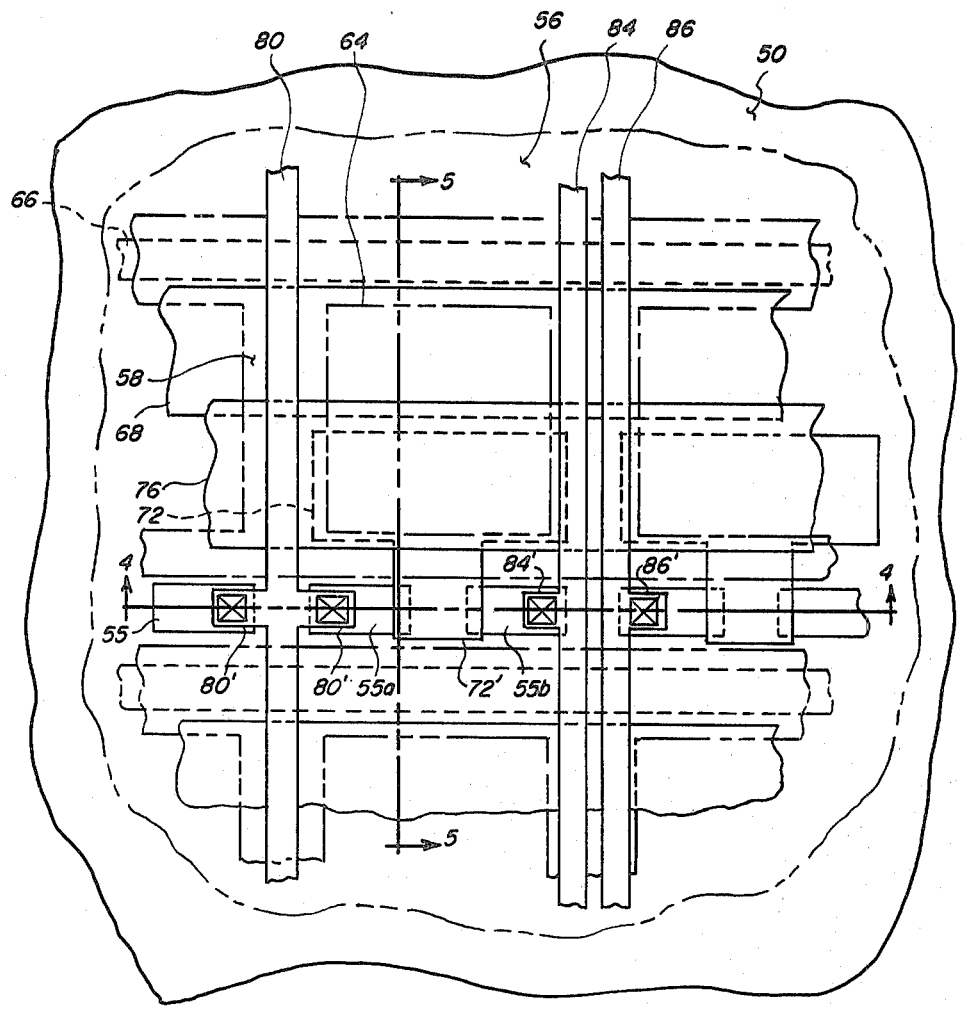
FIG. 3 is a plan view showing the physical construction of the image sensing sites shown in FIG. 2.
Figure 4:
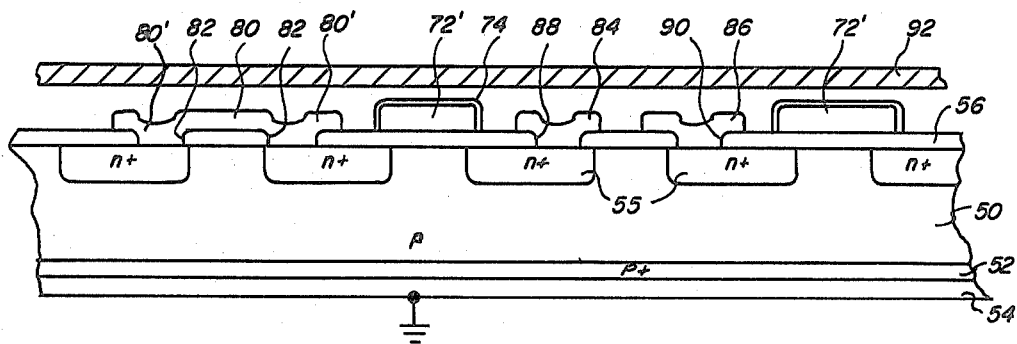
FIG. 4 is a cross-sectional view taken alone line 4—4 of FIG. 3.
Figure 5:
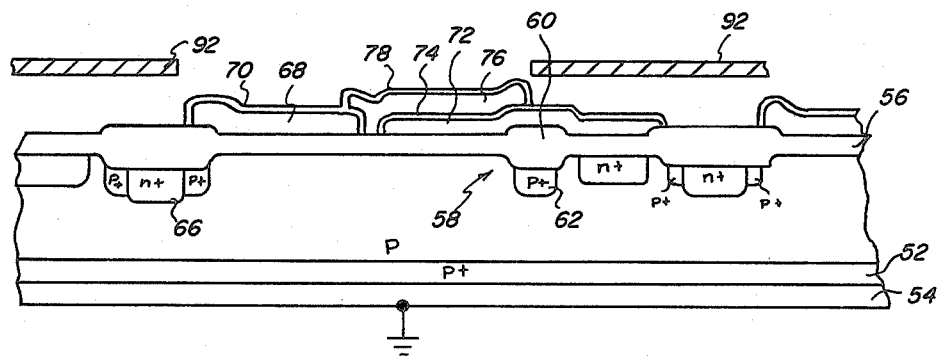
FIG. 5 is a cross-sectional view taken along 5—5 of FIG. 3.

Turning now to FIGS. 3, 4 and 5, the construction of the image sensing elements 22, according to a preferred embodiment of the invention, will be described.

The image sensing elements are formed on a substrate 50 of semiconductor material such as silicon, which has been intrinsically doped to make the material either p-type or n-type. For the sake of example, substrate 50 is p-type silicon doped to 10–20 ohm/cm. A layer 52 on the backside of the device is highly doped with a p-type dopant such as boron to form a layer of low resistivity. A layer 54 of aluminum is formed in ohmic contact over this low resistivity layer, thereby comprising the backside contact of the device. Highly doped n-type diffusions 55 are formed in the substrate to provide the sources and drains of the floating gate FET's for the image sensing elements. A dielectric layer 56 (e.g. silicon dioxide) is formed on the front surface of the substrate. Channel stopping regions 58 conventionally formed of thick field oxide 60 and light p-type diffusions 62 define rows and columns of individual photosensitive areas 64. The photosensitive areas are approximately 30 $\mu m^2$. Conventional antibloom drains 66 formed of highly doped n-type regions are disposed in the middle of one side of channel stopping regions 58. A first conductive electrode 68 is formed on the substrate over the top half (as seen in FIG. 3) of each photosensitive area 64. Each electrode 68 comprises a vertical scan line and is connected to a vertical scan register (not shown in FIG. 3), at the edge of the image sensing array. Electrode 68 forms the first MOS capacitor in the region where the electrode covers the photosensitive area 64. Electrode 68 is of a conductive material which is also transparent, or substantially transparent in the region of the spectrum for which the sensor is designed, such as highly doped polysilicon, or transparent metal oxide for visible image sensors. A thin insulating layer 70 (such as thermally grown silicon dioxide) is formed over electrode 68.

A floating gate 72 is formed on the substrate over the bottom half of each photosensitive area 64. An extension 72' of floating gate 72 crosses over the channel stopping region 58 and simultaneously overlaps portions of two adjacent n-type diffusions (e.g. diffusions 55a and 55b as shown in FIG. 3), thereby creating a floating gate FET. Floating gate 72 is of a conductive transparent material such as highly doped polysilicon. A thin insulating layer 74 (such as thermally grown silicone dioxide) is formed over floating gate 72.

A second conductive electrode 76 is formed over the floating gate 72 in each row of image sensing elements. Electrode 76 is disclosed parallel to and slightly overlapping first electrode 68. The second electrode 76 is supplied with the signal $\Phi_i$, and forms a second MOS capacitor in the region where electrode 76 covers the bottom half of photosensitive area 64. Electrode 76 is of a conductive transparent material such as highly doped polysilicon. A thin insulating layer 78 (such as thermally grown silicon dioxide) is formed over electrode 76.

In every other space between columns of photosensitive areas is formed a source line 80 for making contact with the source diffusions of the floating gate FET's disposed between each row of photosensitive areas. The source line 80 forms branches 80' and 80" to provide ohmic contact with source diffusions 55' through apertures 82 formed in dielectric layer 56. As shown in FIG. 2, the source lines 78 are commonly connected to a load 70 at the periphery of the image sensing array. The source lines are fabricated from a layer of conductive material such as aluminum. In the remaining spaces between columns of photosensitive areas, are formed pairs of drain lines 84 and 86. Drain line 84 defines branches 84' for making ohmic contact with the drain diffusions to the left (as seen in FIG. 3) of the drain line through apertures 88 formed in dielectric layer 56. Drain line 86 defines branches 86' for making ohmic contact with the drain diffusions to the right of the drain line through apertures 90 formed in dielectric layer 56. Drain lines 84 and 86 are formed of conductive material such as aluminum. At the periphery of image sensing array, each drain line is connected to a source of drain voltage $V_d$ through an FET switch (see FIG. 2). The FET switches are driven by the horizontal scan register 24. The regions between rows of photosensitive areas that contain source and drain diffusion 55 are shielded from radiation by shields 92 (not shown in FIG. 3). The light shields are formed for example by aluminum insulated from the underlying electrode structure.

The invention has been described in detail with respect to a preferred embodiment, it will be understood that changes and modifications can be made within the spirit and scope of the invention. For example, although a front side illuminated device has been disclosed, it is apparent that backside illumination could be employed using appropriate transparent backside contacts and shielding of the FET areas. Furthermore, although the invention has been described with respect to an image sensor for sensing radiation in the visible region of the spectrum, the invention could also be employed for sensing infrared radiation.

I claim:

1. A solid state image sensing array comprising a plurality of image sensing elements, each of said elements comprising:
   a first MOS capacitor;
   a second MOS capacitor disposed adjacent said first MOS capacitor; and
   a floating gate FET, the floating gate of said FET being disposed beneath the electrode of said second MOS capacitor, whereby when a photocharge accumulated in said first MOS capacitor is shifted to said second MOS capacitor, the gate of said floating gate FET is modulated to provide a nondestructive amplified readout of said photocharge through said FET.

2. The invention claimed in claim 1, wherein:
   said image sensing elements are arranged in rows and columns;
   said first MOS capacitors in each row being connected in common to a vertical scan register;
   said second MOS capacitors in said array being connected in common to a bias potential;
   the drains of said FET's of said elements in each column being connected in common to a source of drain voltage through an FET switch;
   the FET switch for each column being driven by a horizontal scan register; and
   the sources of the FET's of said elements in said array being connected in common through a load to ground, whereby an output signal from said array may be derived from said common connection at a point in said connection above said load.

3. The invention claimed in claim 2, wherein said first MOS capacitor in said elements in each row are formed by a continuous strip of substantially transparent conductive material.

4. The invention claimed in claim 3, wherein said second MOS capacitor in said elements in each row are formed by a continuous strip of transparent conductive material and said floating gates are formed of transparent conductive material disposed beneath said second MOS capacitor.

5. A solid state image sensing array comprising a plurality of image sensing elements, each of said elements comprising:
   a body of lightly doped semiconductive material;
   a layer of insulating material disposed over the surface of said body of material;
   a first transparent electrode disposed over the surface of said insulating layer, forming a first MOS capacitor;
   a second electrode disposed over the surface of said insulating material adjacent said first electrode, forming a second MOS capacitor;
   a pair of highly doped regions in said body of semiconductive material of opposite conductivity type to said body for forming the source and drain of a field affect transistor disposed adjacent said second electrode; and
   a gate electrode disposed between said second electrode and said insulating layer, and extending over portions of said highly doped regions to form a field affect transistor.

6. The invention claimed in claim 5, wherein said image sensor includes a horizontal and vertical scan register, and wherein said image sensing elements are disposed in rows and columns, said first MOS capacitors in the elements in each row being connected in common to said vertical scan register, said second MOS capacitors in all of said elements being connected in common to a source of bias voltage, the drains of said FET's in the elements in each column being connected in common through switches to a source of drain voltage, the switches being controlled by said horizontal scan register; and the drains of all the FET's in the array being connected in common through a load to ground, whereby an output signal is obtained from said common connection into said drains above said load.

* * * * *